(12) United States Patent
Liang et al.

(10) Patent No.: US 10,477,712 B1
(45) Date of Patent: Nov. 12, 2019

(54) MULTILEVEL ROTATING DRIVE CARRIER AND CABLE RETENTION MECHANISM

(71) Applicant: ZT Group Int'l, Inc., Secaucus, NJ (US)

(72) Inventors: David Liang, West Orange, NJ (US); Dhruv Chawla, Princeton Junction, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 16/272,409

(22) Filed: Feb. 11, 2019

(51) Int. Cl.
*H05K 5/00* (2006.01)
*H05K 5/02* (2006.01)
*H05K 7/14* (2006.01)
*G06F 1/18* (2006.01)

(52) U.S. Cl.
CPC ........... *H05K 5/0226* (2013.01); *G06F 1/182* (2013.01); *H05K 5/0021* (2013.01); *H05K 7/1487* (2013.01); *H05K 7/1489* (2013.01); *H05K 7/1491* (2013.01)

(58) Field of Classification Search
CPC .................................. H05K 5/00; H05K 7/00
See application file for complete search history.

(56) References Cited

U.S. PATENT DOCUMENTS

| | | | | |
|---|---|---|---|---|
| 8,385,062 | B2 * | 2/2013 | Xie | G06F 1/187 361/679.33 |
| 2012/0268889 | A1 * | 10/2012 | Ganta | G11B 33/128 361/679.33 |

* cited by examiner

*Primary Examiner* — Jerry Wu
(74) *Attorney, Agent, or Firm* — Dergosits & Noah LLP; Todd A. Noah

(57) ABSTRACT

A multilevel rotating drive carrier includes stacked top, middle, and bottom drive-holding brackets. The top and middle brackets pivot about a parallel axis from a closed position to an open position to provide access to middle and bottom storage drives. The top bracket makes a storage drive accessible when the carrier is closed or open. Removing one storage drive does not require the disconnecting of another storage drive.

14 Claims, 10 Drawing Sheets

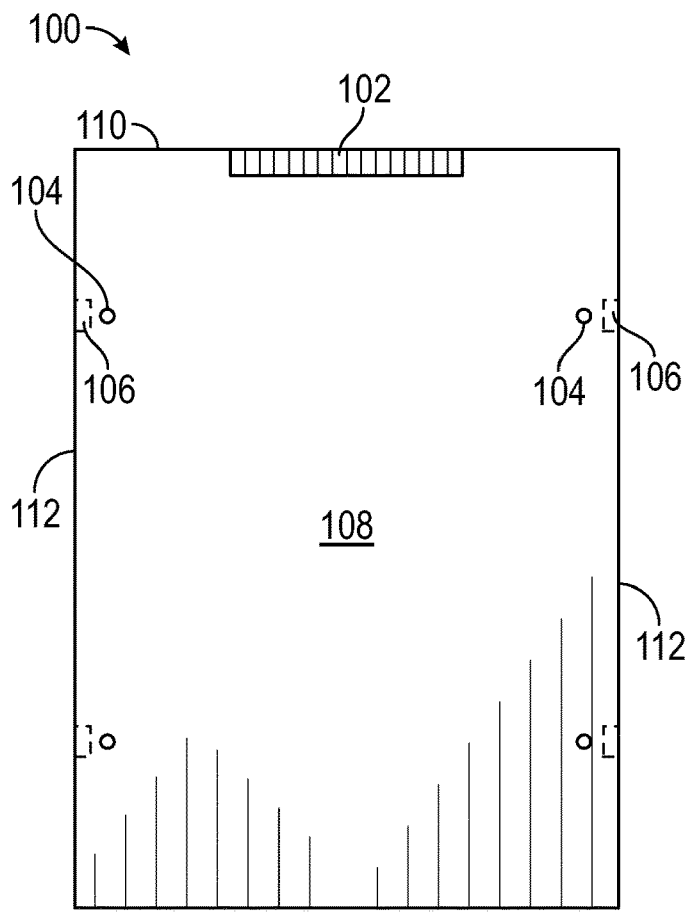
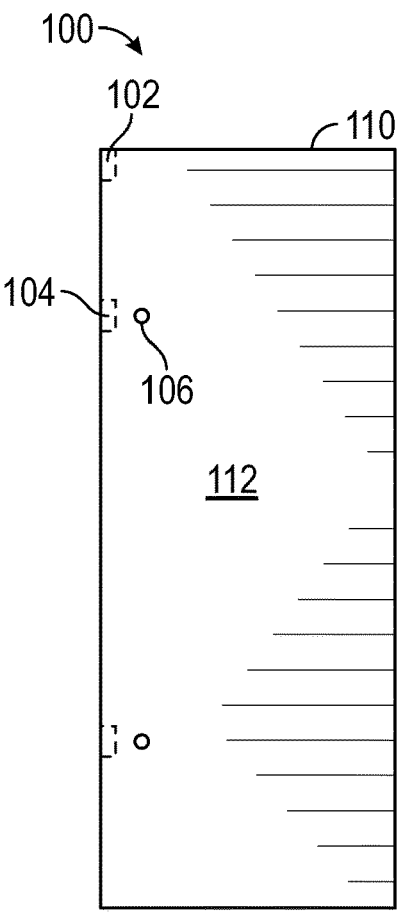
FIG. 1A  FIG. 1B
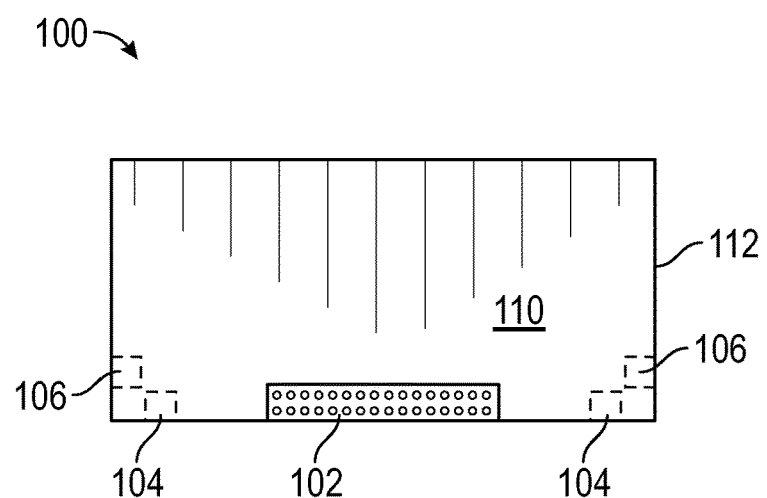
FIG. 1C

MULTILEVEL ROTATING DRIVE CARRIER AND CABLE RETENTION MECHANISM

BACKGROUND

In a typical server, storage drives are stacked one on top of the other, due to space limitations. Standard drive carriers with multiple levels for stacking storage drives vertically are typically attached to the server with threaded fasteners. Such carriers typically require tools to remove the drive carrier for service and maintenance, increasing the time required.

In addition, the connections to storage drives in standard drive carriers may inadvertently become loose or even unplugged during service and maintenance, e.g., service on nearby storage drives or service on the storage drive to which the connector is mated.

Thus, there exists a need for an improved multilevel drive carrier and cable retention mechanism.

BRIEF DESCRIPTION OF THE DRAWINGS

The embodiments are illustrated by way of example and not limitation in the figures of the accompanying drawings, in which like references indicate similar elements, and in which:

FIGS. 1A-1C are bottom, side, and front views of an exemplary storage drive;

DETAILED DESCRIPTION

Figure 2:
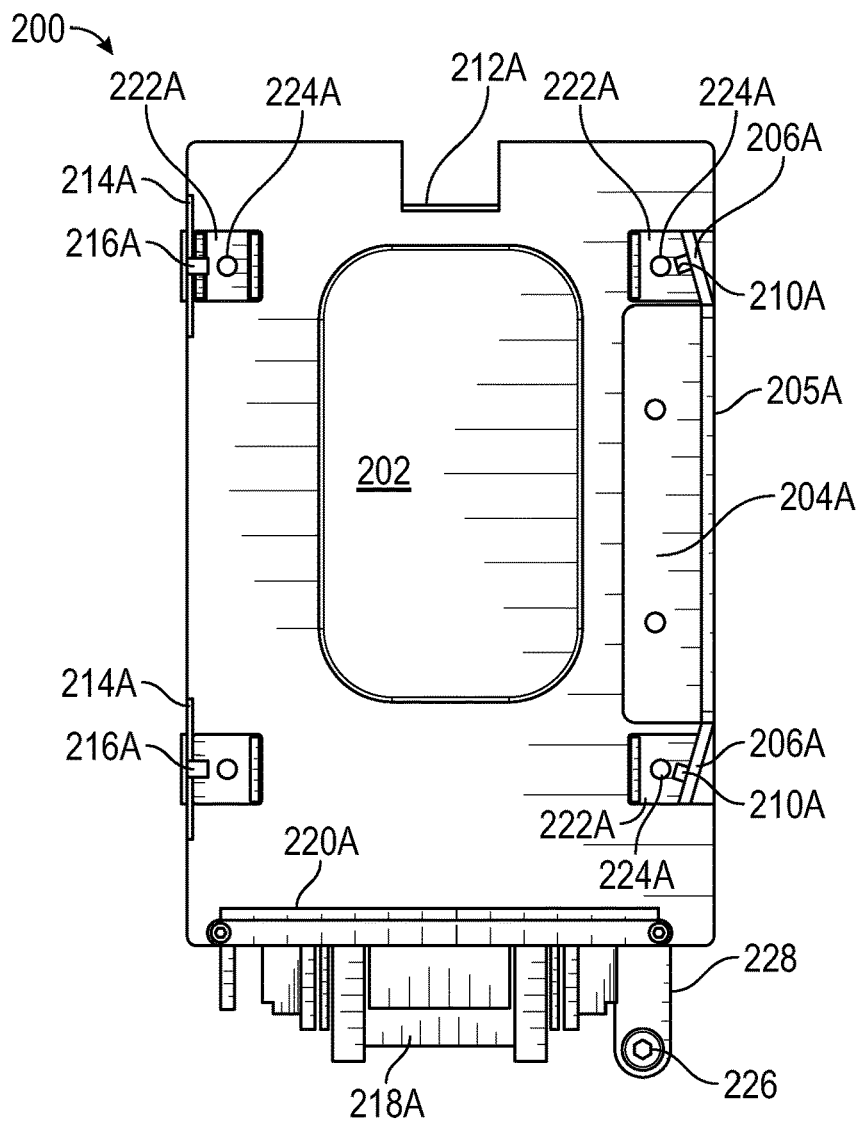
FIG. 2 is a top view of an embodiment of a drive carrier.

As described in this specification, an improved multilevel drive carrier includes stacked top, middle, and bottom drive-holding brackets that rotate with respect to each other. The top and middle brackets pivot about a parallel axis with respect to the bottom bracket and from a closed position to an open position. With the top bracket in the open position, a drive in the middle bracket may be accessed for service or removal without disconnecting or removing drives in the top or bottom brackets. With the middle bracket in the open position, a drive in the bottom bracket may be accessed for service or removal without disconnecting or removing drives in the top or middle brackets. A drive in the top bracket remains accessible when the carrier is closed or open. Removing one storage drive does not require the disconnecting of another storage drive.

In an embodiment, a latch assembly retains the drive carrier in the closed position. The latch assembly may be disengaged by pushing an engaging tooth edge away from an associated latch edge. In addition, the drive carrier may be installed in a server by sliding T-pins disposed on the bottom of the carrier into associated server slots and fixing the carrier in place by hand-tightening a thumb-screw on the carrier into a corresponding nut fixed to the carrier. This tool-less access significantly simplifies and shortens the time required to access a drive and corresponding service time.

In an embodiment, each bracket of the carrier is provided with a connector frame that reinforces the connection between the drive connector and the mating server-side connector. Thus reinforced, the connection is much less likely to be accidentally disconnected.

In an embodiment, disconnecting the drive connector is facilitated by the carrier being easily removed from the server by undoing a single thumb screw and disengaging the carrier from slots in the server. With the carrier removed from the server, access to each level is readily available. For example, to access a drive in the bottom bracket, a technician would only need to disengage a latch and rotate the top two brackets away from the bottom drive. This provides access to the bottom drive for its removal and service. In embodiments, a technician would not need tools to access any drive in the carrier. Thus, the rotating brackets of embodiments are an aspect that helps provide improved access to the drives compared to standard drive carriers.

FIGS. 1A-1C are bottom, side, and front views of an exemplary storage drive 100. In FIG. 1A, exemplary storage drive 100 includes a drive connector 102 oriented to face a front face 110. A bottom face 108 is provided with openings 104 for engaging elements of a drive carrier. A side 112 of carrier 100 is provided with openings 106 for engaging elements of the drive carrier. In some exemplary storage drives, openings 104 and 106 may be threaded. In FIGS. 1A-1C, connector 102 is illustrated as being a female connector having male connector pins, but embodiments of the drive carrier disclosed within may be configured to cooperate with other drive connector configurations.

FIG. 2 is a top view of an embodiment of a multi-level drive carrier 200. In FIG. 2, drive carrier 200 includes a top bracket 202 with, on one side, a perpendicular leaf spring 205A attached with a flange 204A that is parallel to the mounting surface of bracket 202. Leaf spring 205A includes spring ends 206A that are resiliently flexible with respect to horizontal flange 204A. Spring ends 206A include bracket-engaging elements 210A or "bumps" that are dimensioned and positioned to engage corresponding openings 106 of drive 100. On the opposite side, bracket 202 includes perpendicular side flanges 214A, which are provisioned with bracket-engaging elements 216A that are dimensioned and positioned to engage corresponding side openings 106 of storage exemplary drive 100. On a rear side, bracket 202 includes a perpendicular rear flange 212A. On a front side, bracket 202 includes a connector frame 218A with a drive-side face 220A. Connector frame 218A is not a connector itself. Rather, connector frame 218A receives a connector (1000, FIG. 10) that mates with drive connector 102 and has elements that retain the mating connector 1000 securely. On a bottom side, bracket 202 includes mounting springs bridge lances 222A, on which drive 100 is seated provide with engaging elements 224A that are dimensioned and positioned to engage corresponding bottom openings 104 of storage exemplary drive 100. Visible below top bracket 202 is an extension 228 from a bottom bracket 502 (FIG. 5) with a thumb screw 226.

Top bracket 202 uses leaf spring 205A to urge drive 100 into the proper position. The use of leaf spring 205A is an aspect that helps install a drive in a bracket and secure it without the need of any fasteners or separate brackets.

In FIG. 2, engaging elements 210A and engage and hold storage drive 100 securely to bracket 202 without requiring tools to engage or disengage drive 100. In the embodiment, engaging elements 210A and 216A are "bumps" with part or all of each bump fitting within holes 106 to retain drive 100. Leaf spring ends 206A flex to allow for the insertion of drive 100 between leaf spring 205A and opposing side flanges 214A and to allow drive 100 to be properly positioned. Leaf spring ends 206A then apply a constant force on drive 100 to retain drive 100. Engaging elements 210A and 216A are positioned to align with holes 106 on the sides of drive 100 and fit snugly within. Rear flange 212A and frame drive-side face 220A are positioned on bracket 202 to orient drive 100 in the fore/aft direction so that the engaging holes of drive 100 line up with the engaging elements of bracket 202.

In other embodiments, the engaging elements may have varying shapes that engage the holes of drive 100 securely and facilitate the engaging and disengaging process. For example, the engaging elements may be cylindrical, or they may have ramps at the engaging end that are oriented to facilitate sliding into the corresponding hole of drive 100. Leaf spring ends 206A flex to receive drive 100 between leaf spring 205A and opposing side flanges 214A and to allow drive 100 to be properly positioned.

In FIG. 2, when a drive 100 is mounted to bracket 202, connector frame 218A allows a mating connector to pass through drive-side connector face 220A and connect with connector 102 of drive 100. Connector frame 218 includes retaining elements 702, 704, 706 that engage the mating connector and resist its being disconnected (which are discussed further within regarding FIG. 7). In an embodiment, part of drive connector 102 may be received within connector frame 218A.

Figure 3:
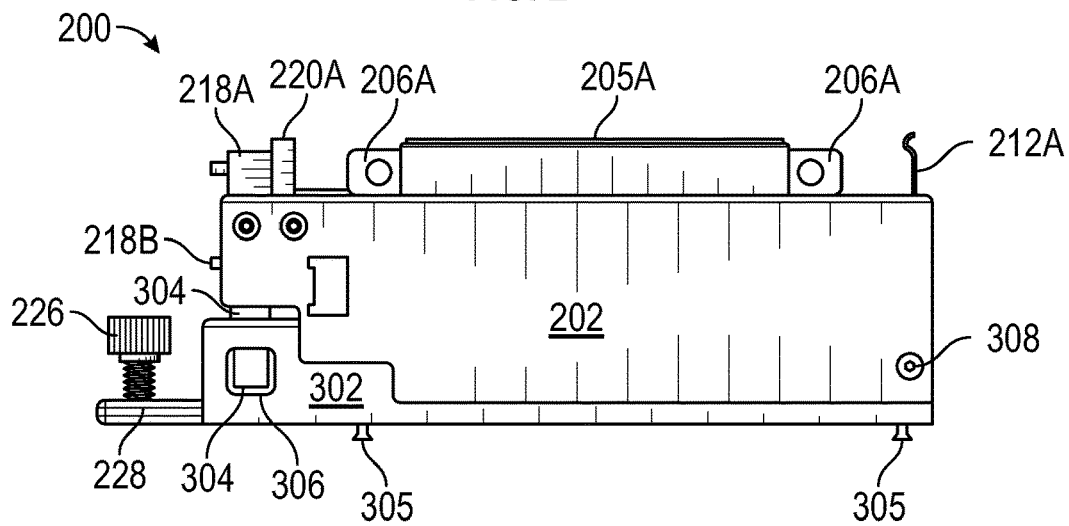
FIG. 3 is a side view of the drive carrier of FIG. 2 in a closed position.

Thumb screw 226 is an element of a mechanism for connecting drive carrier 200 to a server. This mechanism also includes T-pins 305 as shown in FIG. 3 that are disposed on the bottom of bottom bracket 502 shown in FIG. 5. The T-pins 305 extend from the bottom of bottom bracket 502 and slide into associated slots in the server. Carrier 200 is then fixed in place by inserting thumb screw 226 into a corresponding nut fixed to the server. Thumb screw 226 is then hand-tightened. Thumb screw 226, along with the three T-pins on the base of carrier 200 provide for the tool-less installation and removal of carrier 200 from a server.

The connector frame, e.g., connector frame 218A, secures connector 1000 by snuggly receiving the top, bottom, left, and right sides of the connector, and with the retaining force of catch 706. After connector 1000 has been fully inserted, the interconnected spring supports 702, 704 and catch 706 apply a force to connector face 1002, ensuring proper, secure contact between the computer cable connector and the gold-plated connector pins of the drive. By using a force gauge, it is determined that an outward force of approximately 8 lbs. must be applied to remove the cable, which is high and shows that the bracket provides very high cable retention.

In the figures that follow, a middle bracket 402 (FIG. 4) and bottom bracket 502 (FIG. 5) include elements that are identical to those of top bracket 202. The description of the element regarding top bracket 202 applies to the identical elements of middle bracket 402, and bottom bracket 502. These identical elements are labeled with an "A" regarding top bracket 202 (e.g., connector frame 218A), with a "B" regarding middle bracket 402 (e.g., connector frame 218B), and with a "C" regarding bottom bracket 502 (e.g., connector frame 218C).

In an embodiment, a drive carrier 200 may be constructed using sheet-metal fabrication techniques that are cost effective, facilitate manufacturing the carrier in quantity and quickly, and ensure the carrier's structural integrity without requiring excessive weight. Constructing each bracket with such techniques or using hard tooling ensure a bracket does not experience plastic deformation by the force applied on it during the installation and removal of the drive or computer cable connector. In an embodiment, the connector frame may be constructed of plastic.

FIG. 3 is a side view of drive carrier 200 of FIG. 2 in a closed position. FIG. 3 further illustrates how drive-side face 220A and rear flange 212A define the fore/aft position of drive carrier 100. A connector frame 218B for middle bracket 402 is partly visible behind a side flange of bracket 202. Top bracket 202 includes a latch element 304 that engages with a latch element 306 of a flange 302 of bottom bracket 502. In the embodiment, latch element 304 has a tooth and latch element 306 is an opening with an edge, the tooth of latch element 304 engaging the edge of latch element 306 to hold carrier 200 in the closed position illustrated. FIG. 3 also illustrates that the side flange of top bracket 202 includes a pivot point 308. Top bracket 202 is attached to bottom bracket 502 at pivot point 308. When latch element 304 is pushed and disengaged from latch element 306, top bracket 202 may be easily pivoted away from bottom bracket 502 about pivot point 308 to provide access to, e.g., mount or remove a drive from bottom bracket 502. In the embodiment, there is no need to disturb any connectors in connector frames 218A or 218B when pivoting top bracket 202 away from bottom bracket 502. In other words, carrier 200 may be opened easily by pressing on a user-friendly latch to get access to each separate level.

Figure 4:
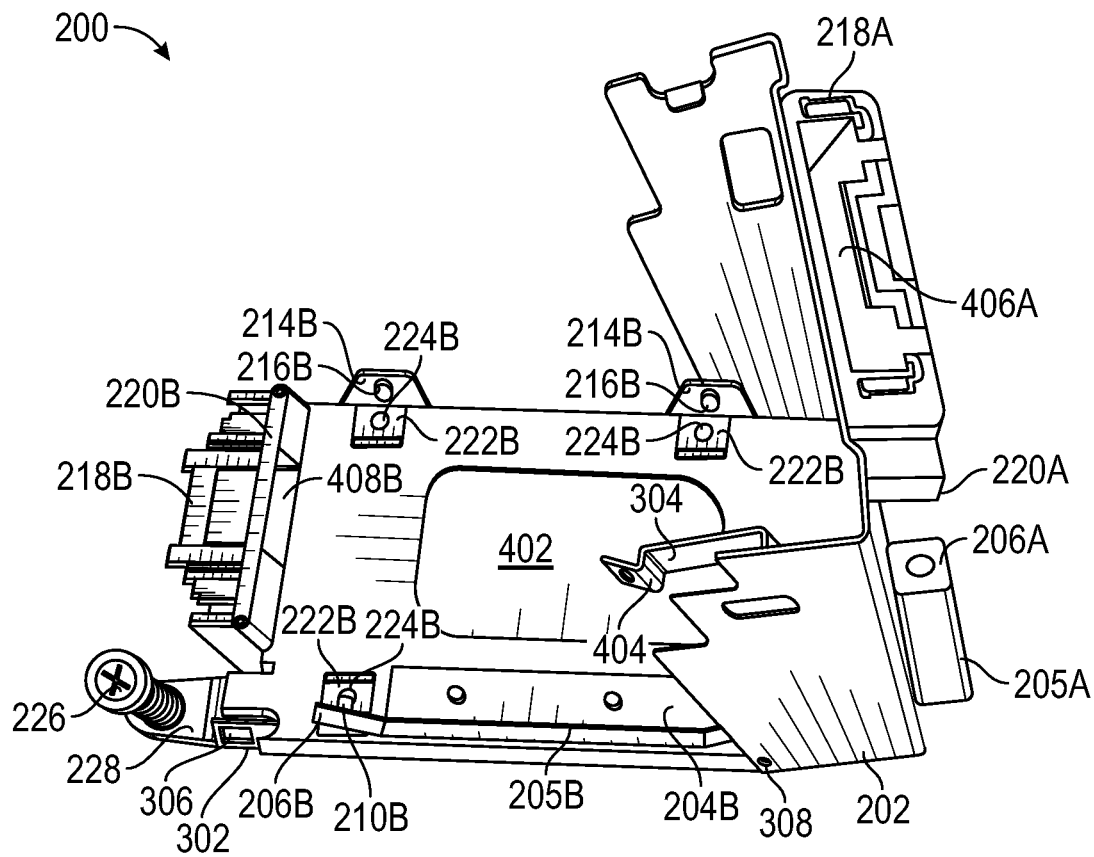
FIG. 4 is a side perspective view of the drive carrier of FIG. 2 in an open position.

FIG. 4 is a side perspective view of drive carrier 200 of FIG. 2 in an open position. In FIG. 4, a latch edge 404 (or "tooth") latch element 304 has been disengaged from latch element 306 and top bracket 202 has been pivoted (or "rotated") from the closed position to the open position, which reveals middle bracket 402. With top bracket 202 in this position and middle bracket 402 remaining unrotated, a drive may be installed in or dismounted from middle bracket 402 without disturbing any drive-in top bracket 202 or bottom bracket 502. FIG. 4 also illustrates that each connector frame, e.g., connector frame 218B, has front and rear face openings, e.g., front face opening 406A (of frame 218A) and rear face opening, e.g., face opening 408B in drive-side face 220B, configured to allow a mating connector to pass through to connect with connector 102 of storage drive 100 (when mounted).

Figure 5:
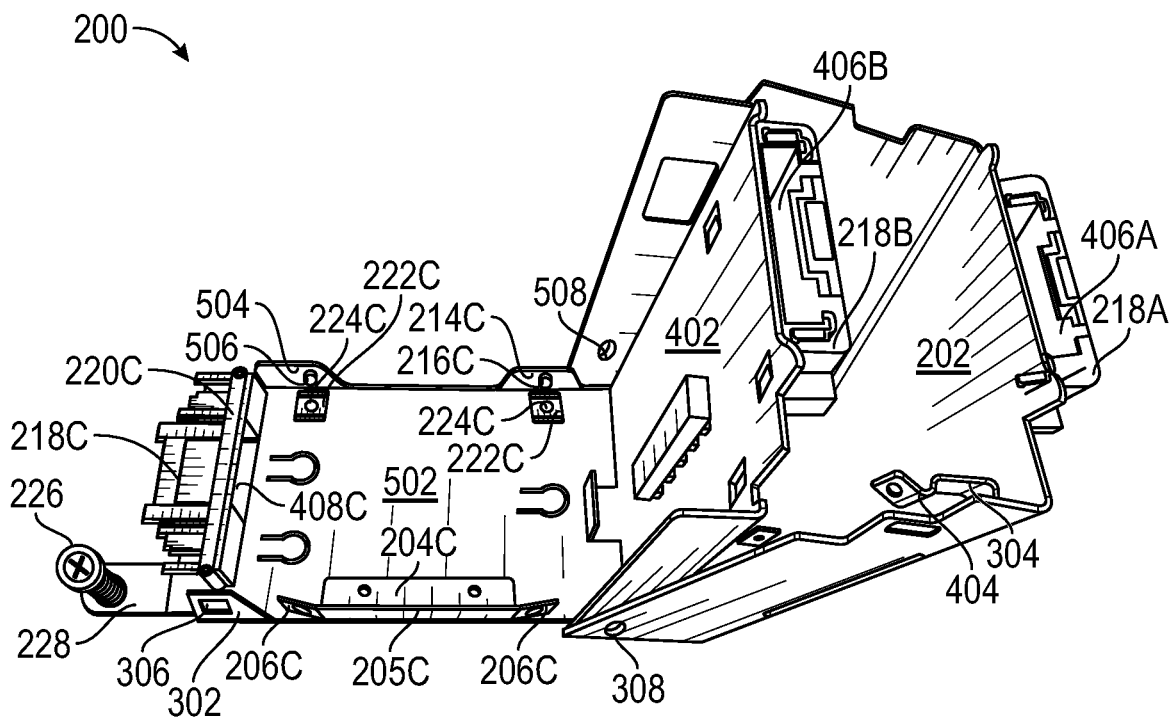
FIG. 5 is a side perspective view of the drive carrier of FIG. 2 in an open position.

FIG. 5 is a side perspective view of drive carrier 200 of FIG. 2 in an open position. In FIG. 5, bottom level bracket 502 is shown to be accessible when both top bracket 202 and middle bracket 402 have been rotated open, about pivot point 308. Pivot point 308 is shown to have a corresponding pivot point 508 on the opposing flange 510 of bracket 502. Flange 510 includes an engaging element 506. Bottom bracket 510 also includes a side flange 504 supporting an engaging element 506. Engaging elements 506 are dimensioned and positioned to engage corresponding holes 106 of drive 100 like engaging elements 216A. Side flanges 504 and 508 are configured differently from side flanges 214A, illustrating that such flanges may have a variety of shapes.

In FIG. 5, top bracket 202 and middle bracket 402 are shown to pivot about pivot points 308, 508 with respect to bottom bracket 502. Similarly, middle bracket 402 may pivot down into the closed position while top bracket 202 remains in the open position. By being able to pivot brackets independently in this manner, carrier 200 allows drives to be installed or removed from a bracket, or maintenance to be performed on a drive installed in a bracket, without having to disconnect either of the other two drives in the carrier.

In the embodiment of FIG. 5, brackets 402, 502 pivot or rotate about an axis defined by pivot points 308, 508. In an embodiment, such an axis may be defined by a hinge attached to the rear edge or a rear flange of bottom bracket 502. In such an embodiment, middle bracket 402 may be provided with a rear flange from its rear edge to connect to the hinge. Similarly, top bracket 202 may be provided with a rear flange to connect to the hinge. Top bracket 202 and middle bracket 402 could then pivot about the hinge axis to provide the same benefits described regarding pivoting about pivot points 308, 508. In an embodiment, top bracket 202 could be connected to a hinge on a rear edge of bracket 402. And bracket 402 may be connected to a hinge on a read edge of bracket 502 to achieve the same benefits described regarding pivoting about pivot points 308, 508.

Figure 6:
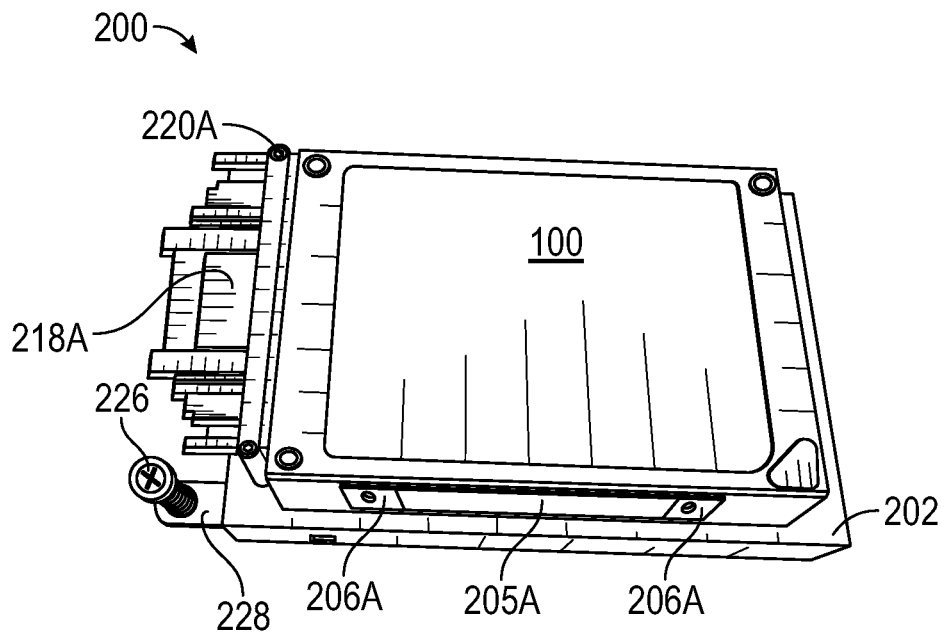
FIG. 6 is a perspective view of the drive carrier of FIG. 2 in a closed position holding a storage drive.

FIG. 6 is a perspective view of drive carrier 200 of FIG. 2 in a closed position holding exemplary storage drive 100. In FIG. 6, resilient spring ends 206A are illustrated urging drive 100 toward the opposing flanges 214A (FIG. 2). Drive-side face 220A is shown defining a front boundary for drive 100.

Figure 7:
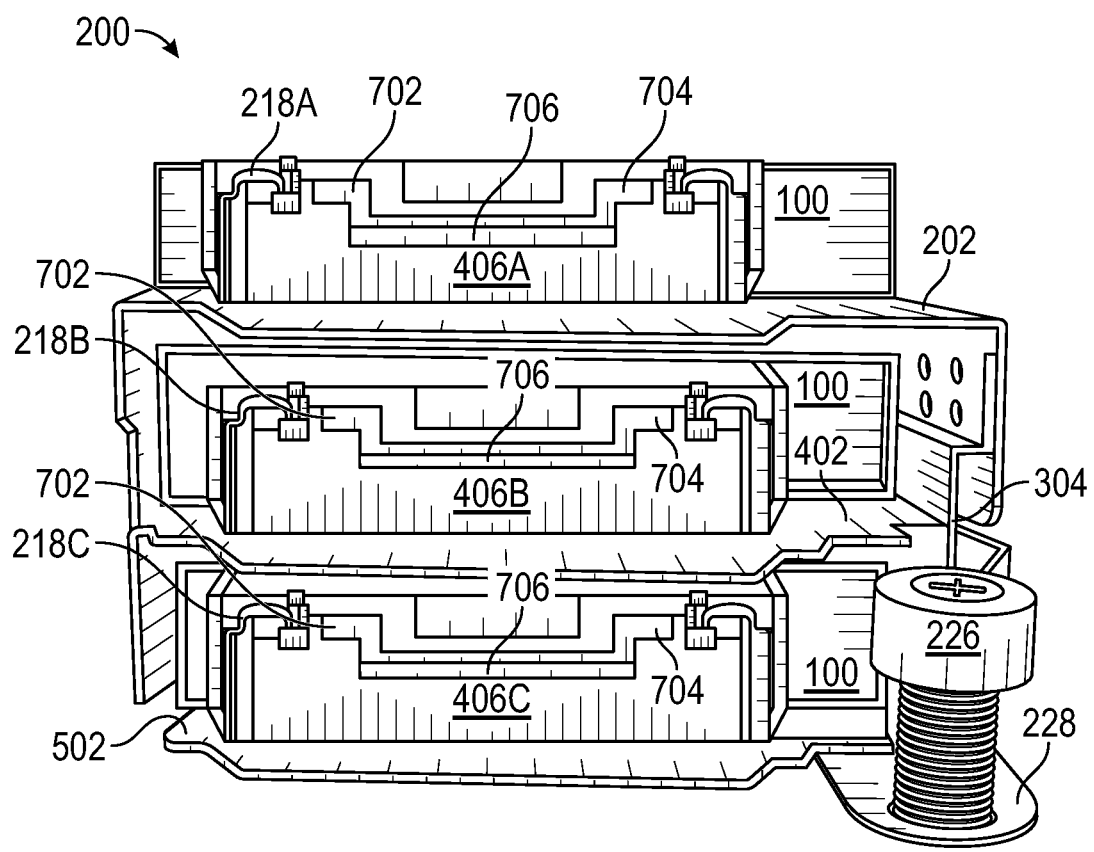
FIG. 7 is a front view of the drive carrier of FIG. 2 in a closed position holding three storage drives.

FIG. 7 is a front view of drive carrier 200 of FIG. 2 in a closed position holding three storage drives 100. In FIG. 7, each connector frame, e.g., frame 218A, includes a frame connector catch 706 to the main body of frame 218A using catch supports 702, 704. In the embodiment, catch 706 may be raised slightly and a mating connector 1000 (FIG. 10) may be inserted into a connector opening, e.g., opening 406A, until a connection is made with connector 102 of drive 100. When the connection is completed, an edge of catch 706 retains connector 1000 (FIG. 10) in the connected state by resisting movement of a connector face 1002 (FIG. 10) that would tend to disengage connector 1000.

Figure 8:
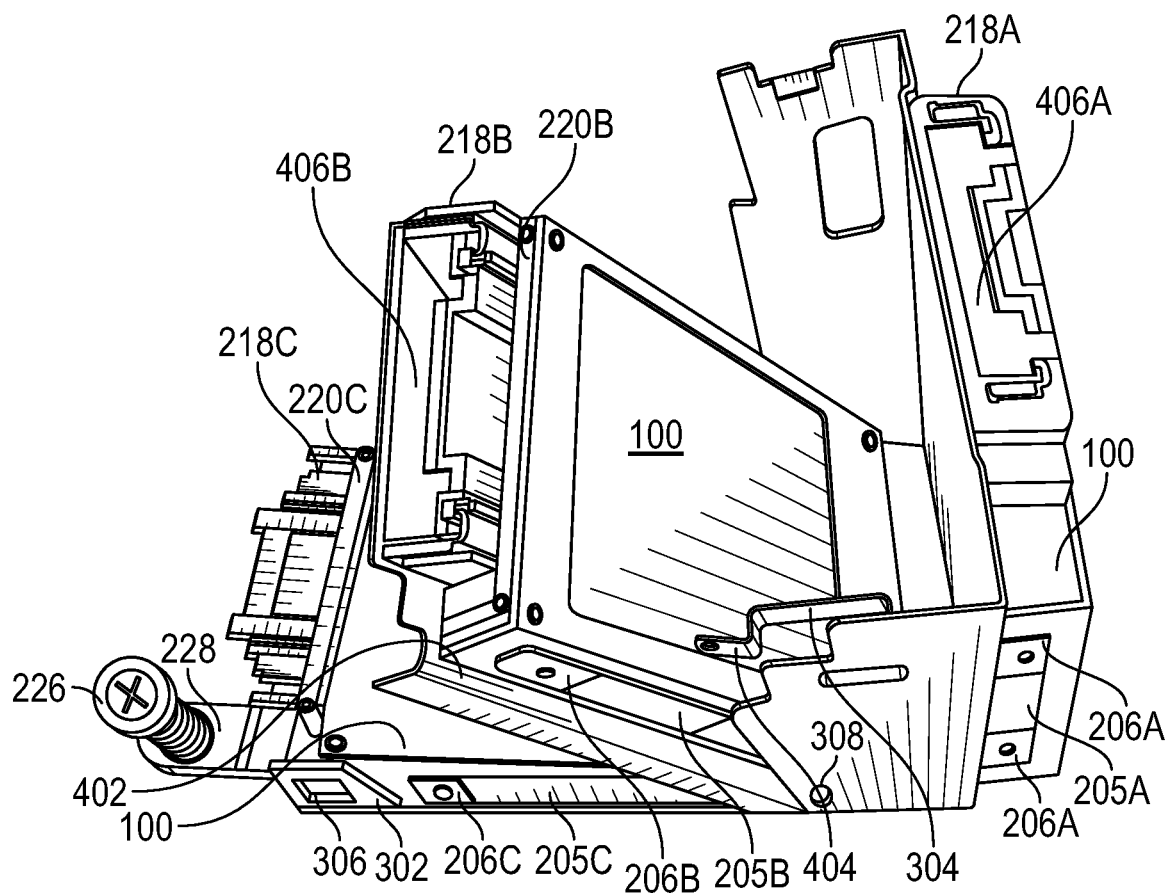
FIG. 8 is a side perspective view of the drive carrier of FIG. 2 in an open position holding three storage drives.

FIG. 8 is a side perspective view of drive carrier 200 of FIG. 2 in an open position holding three storage drives. FIG. 8 further illustrates that top bracket 202, when holding drive 100, may be rotated open to allow access to remove or service drive 100 mounted in middle bracket 402 without disconnecting any connections to any of the installed drives. Similarly, middle bracket 402, when holding drive 100, may be rotated open to allow access to remove or service drive 100 mounted in bottom bracket 502.

Figure 9:
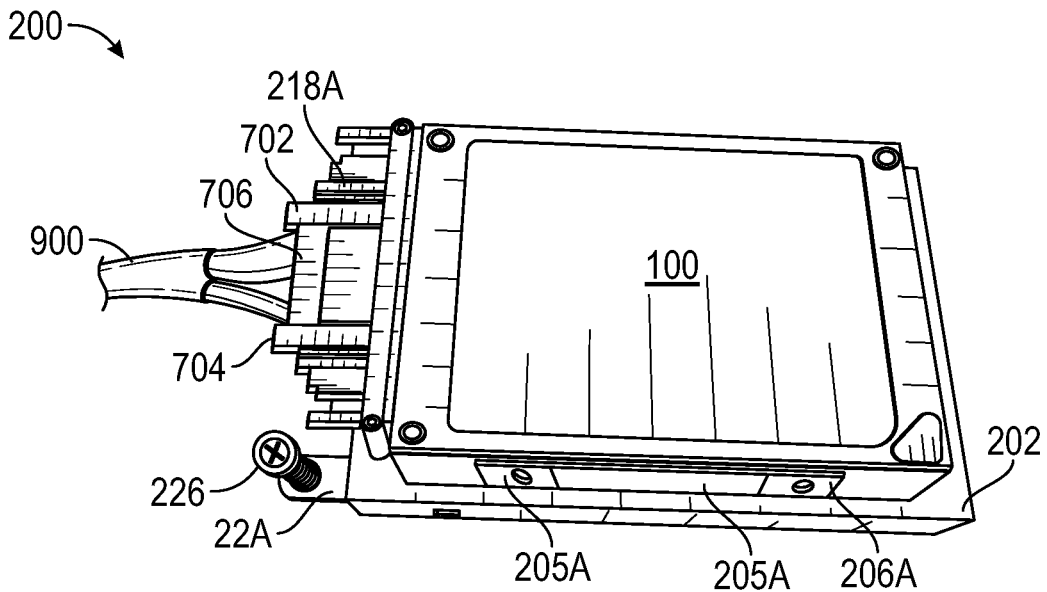
FIG. 9 is a side perspective view of the drive carrier of FIG. 2 in a closed position holding a storage drive connected to a computer cable.

FIG. 9 is a side perspective view of drive carrier 200 of FIG. 2 in a closed position holding storage drive 100 connected to server cable 900. FIG. 9 shows computer cable 900 connected to drive 100 through connector frame 218A.

Figure 10:
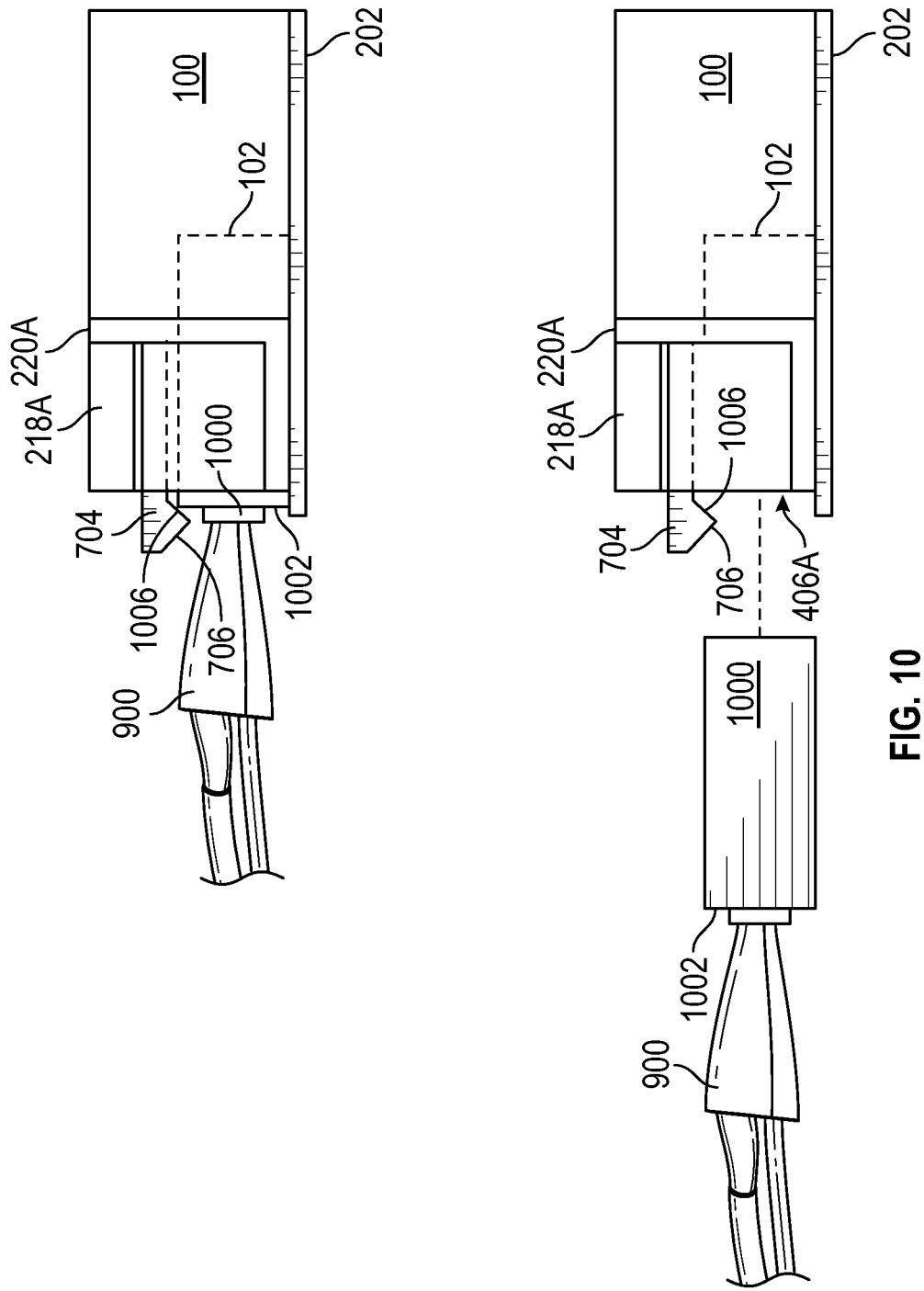
FIG. 10 is a side perspective detail view of the drive carrier of FIG. 2 in a closed position holding a storage drive connected to a computer cable.

FIG. 10 includes two side views of bracket 202 of drive carrier 200 of FIG. 2. The top view illustrates top bracket 202 holding storage drive 100 connected to server cable 900. Storage drive 100 is connected with server cable 900 by a server-side connector 1000. Connector 1000 inserted into connector frame 218A and passes through drive side face 220A to mate with drive-side connector 102. In the lower view of FIG. 10, connector 1000 has been disconnected to illustrate that connector 1000 has a connector face 1002 about the perimeter of server cable 900. Inserting connector 1000 into connector frame face opening 406A causes connector frame 1000 to urge catch supports 702, 704 up, raising catch 706 clear of connector 1000. As connector 1000 is inserted into frame 218A, catch 706 moves up to allow connector 1000 to be pushed inwards. Once connector 1000 is fully inserted, catch 706 springs back down, and inclined edge 1006 comes in contact with connector face 1002 and applies constant retention force on connector 1000. Due to the angle of inclined edge 1006, the force applied by inclined edge 1006 includes both inward (retentive) and downward forces, both of which help retain connector 1000 mated to drive 100. A feature of connector frame 218A is that the inclined ramp on the front of catch 706 allows connector 1000 to be inserted without having to independently raise catch 706. On insertion, the forward motion of connector 1000 against the ramp of catch 706 urges catch 706 upward and allows connector 1000 to pass through connector frame 218A. Similarly, a feature of connector frame 218A is that inclined edge 1006 allows connector 1000 to be withdrawn without having to independently raise catch 706. When disconnecting, the withdrawing motion of connector 1000 against inclined edge 1006 urges catch 706 upward and allows connector 1000 to escape from within connector frame 218A. In contrast, if connector 1000 was retained by a vertical edge against connector face 1002, then (given normal withdrawing forces) catch 706 would need to be lifted independently to allow connector 1000 to be withdrawn.

Figure 11:
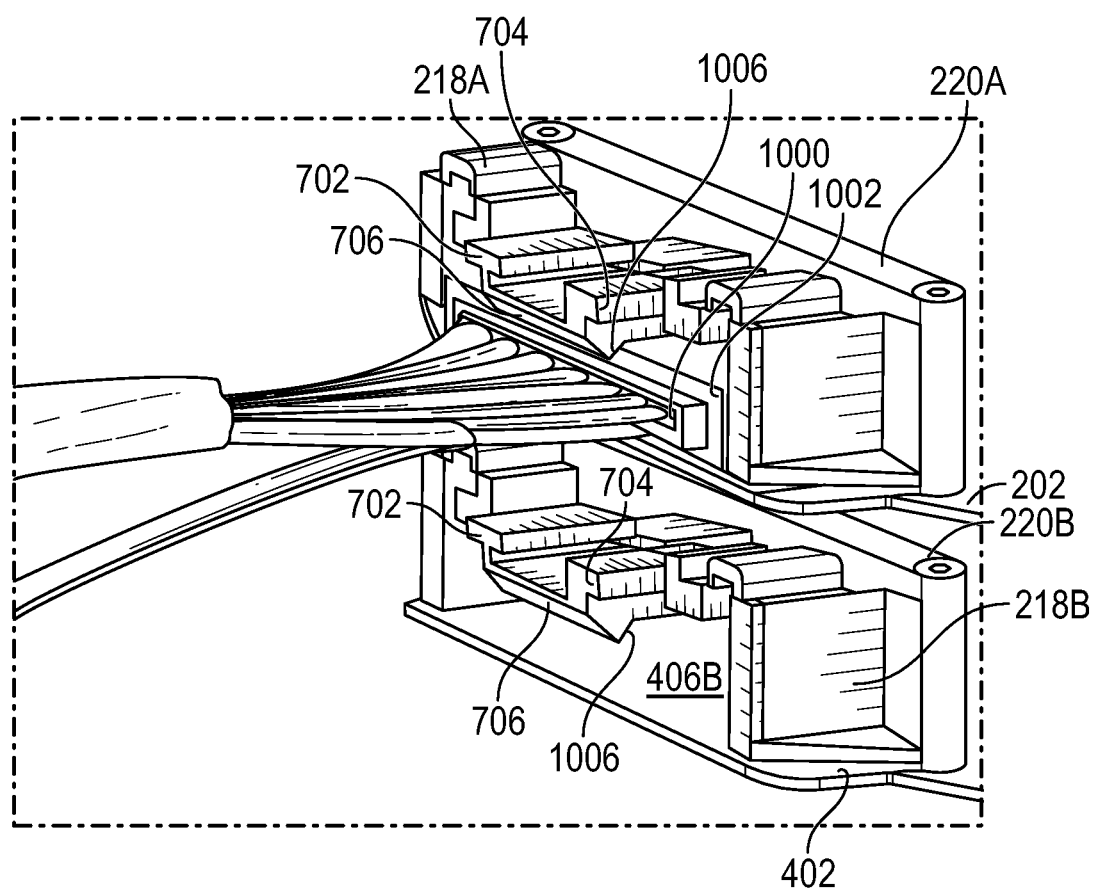
FIG. 11 is a side perspective detail view of the drive carrier of FIG. 2 in a closed position holding a storage drive connected to a computer cable.

FIG. 11 is a side perspective detail view of drive carrier 200 of FIG. 2 in a closed position holding storage drive 100 connected to server cable 900. Regarding connector frame 218A, FIG. 11 further illustrates the relationship between connector face 1002 and edge 1006 of connector catch 706. Regarding connector frame 218B, FIG. 11 further illustrates the position of catch 706 and edge 1006 when connector opening 406B is not populated with a connector.

Figure 12:
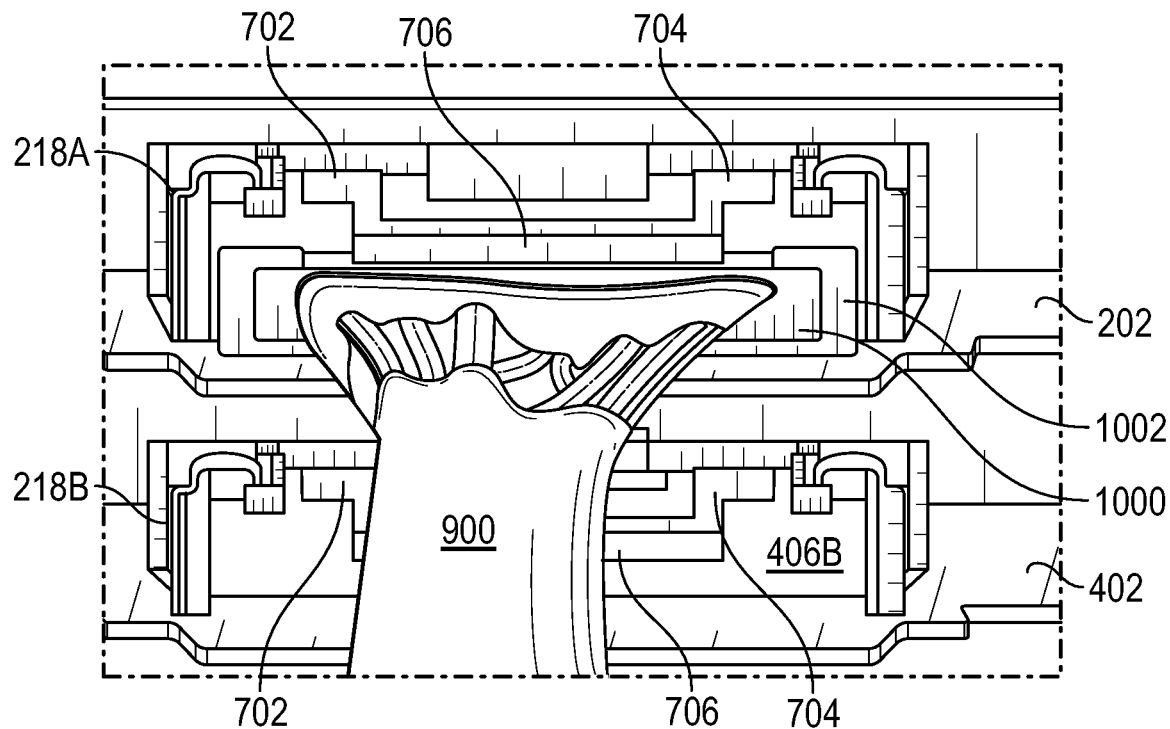
FIG. 12 is a front detail view of the drive carrier of FIG. 2 in a closed position holding a storage drive connected to a computer cable.

FIG. 12 is a front detail view of drive carrier 200 of FIG. 2 in a closed position holding storage drive 100 connected to server cable 900. Regarding connector frame 218A, FIG. 12 further illustrates the relationship between connector face 1002 and catch 706, with catch 706 dropping down in front of face 1002 to retain connector 1000 in place. Regarding connector frame 218B, FIG. 12 further illustrates the position of catch 706 and supports 702, 704 when connector opening 406B is not populated with a connector.

Figure 13:
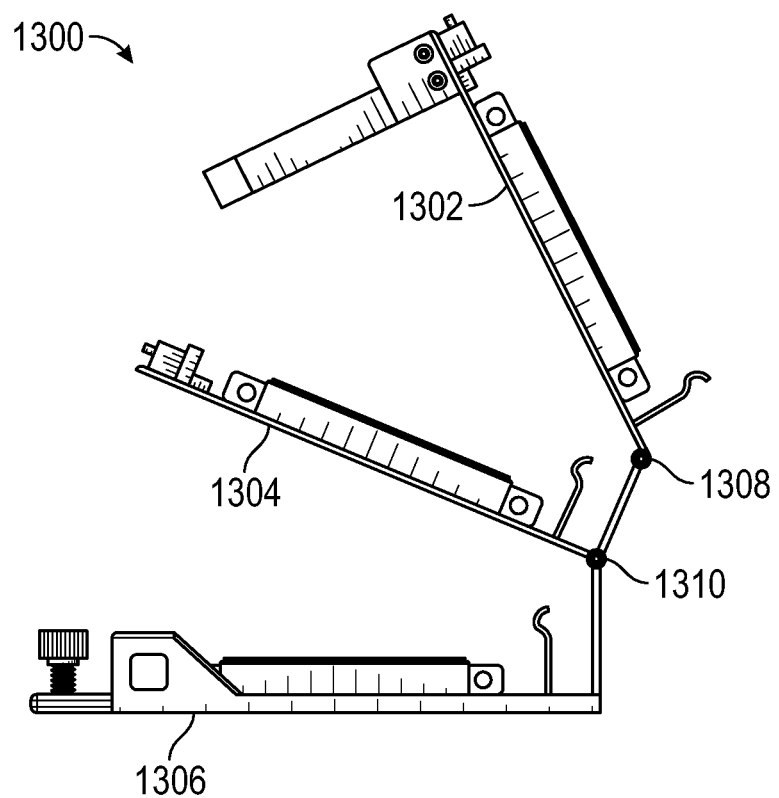
FIG. 13 is side view of an embodiment of a drive carrier in an open position.

FIG. 13 is side view of a drive carrier 1300 in an open position. In FIG. 13, carrier 1300 includes a top bracket 1302, a middle bracket 1304, and a bottom bracket 1306. Top bracket 1302 may be rotated from a closed position to an open position about a hinge 1308. Middle bracket 1304 may be rotated from a closed position to an open position about a hinge 1310. Otherwise, carrier 1300 may have the features previously described regarding carrier 200. In an embodiment, the hinge axes may be aligned with a rear edge of a carrier bracket (an edge on the rear—the side opposing the connector frame). In an embodiment, the hinge axes may be aligned with a side edge of a carrier bracket.

Figure 14:
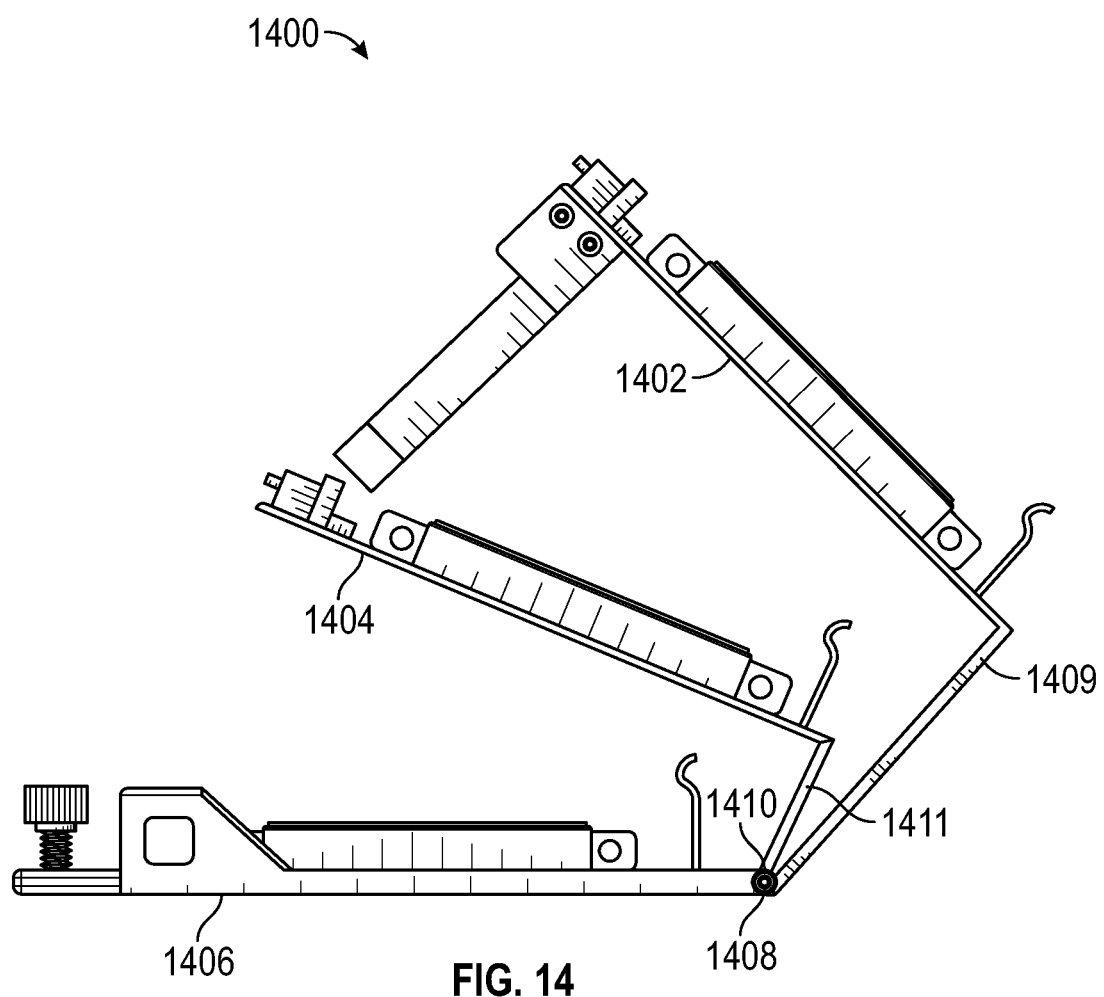
FIG. 14 is side view of an embodiment of a drive carrier in an open position.

FIG. 14 is side view of a drive carrier 1400 in an open position. In FIG. 14, carrier 1400 includes a top bracket 1402, a middle bracket 1404, and a bottom bracket 1406. Top bracket 1402 may be rotated from a closed position to an open position about a hinge element 1408 connected to bottom bracket 1406 and connected to top bracket 1402 by a flange 1409. Middle bracket 1404 may be rotated from a closed position to an open position about a hinge element 1410 connected to bottom bracket 1406 and connected to top bracket 1402 by a flange 1411. Otherwise, carrier 1400 may have the features previously described regarding carrier 200. In an embodiment, the hinge elements may be aligned with a rear edge of a carrier bracket (an edge on the rear—the side opposing the connector frame). In an embodiment, hinge elements 1408 and 1410 may be connected about a common axis. In an embodiment, hinge elements 1408 and 1410 may have separate but parallel axes. In an embodiment, the hinge elements may be aligned with a side edge of a carrier bracket.

Figure 15:
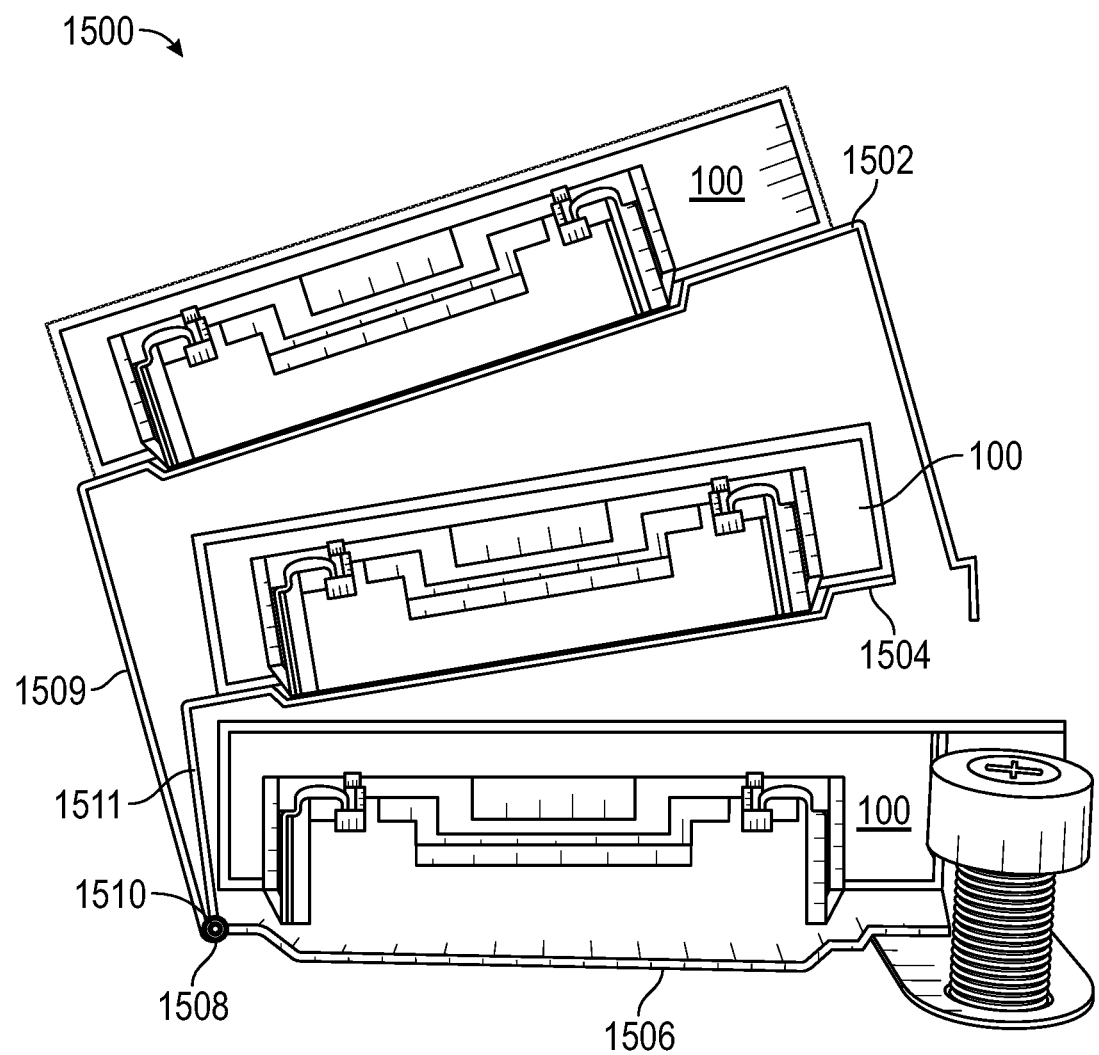
FIG. 15 is front view of an embodiment of a drive carrier in an open position.

FIG. 15 is front view of a drive carrier 1500 in an open position. In FIG. 15, carrier 1500 includes a top bracket 1502, a middle bracket 1504, and a bottom bracket 1506. Top bracket 1502 may be rotated from a closed position to an open position about a hinge element 1508 connected to bottom bracket 1506 and connected to top bracket 1502 by a flange 1509. Middle bracket 1504 may be rotated from a closed position to an open position about a hinge element 1510 connected to bottom bracket 1506 and connected to top bracket 1502 by a flange 1511. Otherwise, carrier 1500 may have the features previously described regarding carrier 200. In an embodiment, the hinge elements may be aligned with a rear edge of a carrier bracket (an edge on the rear—the side opposing the connector frame). In an embodiment, hinge elements 1508 and 1510 may be connected about a common axis. In an embodiment, hinge elements 1508 and 1510 may have separate but parallel axes.

It is understood that any specific order or hierarchy of steps in any disclosed process is an illustration of an approach. Based upon design preferences, it is understood that the specific order or hierarchy of steps in the processes may be rearranged, or that not all illustrated steps be performed. Some of the steps may be performed simultaneously.

Moreover, the separation of various apparatus components in the embodiments described above should not be understood as requiring such separation in all embodiments.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

We claim:
1. An apparatus comprising:
   a first bracket configured to hold a first electronic device and to attach to a computer and including at least one pivot point defining a pivot axis;
   a second bracket configured to hold a second electronic device parallel to the first electronic device and including at least one first flange rotatably connected to the pivot point; and
   a third bracket configured to hold a third electronic device parallel to the first and second electronic devices and including at least one second flange rotatably connected to the at least one pivot point, wherein:
   when the first, second, and third electronic devices are fungible devices, each including a first connector at a connector end, and connected to the computer and held in the first, second, and third brackets, respectively:
   pivoting the third bracket about the at least one pivot point from a closed position to a first open position with respect to the second bracket provides access to remove the second electronic device without disconnecting or removing the third electronic device or the first electronic device;
   pivoting the second bracket about the at least one pivot point from the closed position to a second open position with respect to the first bracket provides access to remove the connector end of the first electronic device without disconnecting or removing the second electronic device or the third electronic device; and
   the third bracket provides access to remove the connector end of the third electronic device in the first closed position and in the first open position without disconnecting or removing the first electronic device or the second electronic device.

2. The apparatus of claim 1 further comprising:
   a first leaf spring connected to a first side of the first bracket and urging the first electronic device toward a second side of the first bracket;
   a second leaf spring connected to a first side of the second bracket leaf and urging the second electronic device toward a second side of the second bracket; and
   a third leaf spring connected to a first side of the third bracket leaf and urging the third electronic device toward a second side of the third bracket.

3. The apparatus of claim 2 further comprising:
   a first plurality of engaging elements connected to the second side of the first bracket and configured to engage the first electronic device;
   a second plurality of engaging elements connected to the second side of the second bracket and configured to engage the second electronic device; and
   a third plurality of engaging elements connected to the second side of the third bracket and configured to engage the third electronic device.

4. The apparatus of claim 3 further comprising:
   a fourth plurality of engaging elements connected to the first leaf spring and configured to engage the first electronic device;

a fifth plurality of engaging elements connected to the second leaf spring and configured to engage the second electronic device; and a sixth plurality of engaging elements connected to the third leaf spring and configured to engage the third electronic device.

5. The apparatus of claim 1, wherein, the first connector configured to connect to a second connector, and the first, second, and third brackets are configured to hold the first, second, and third electronic devices with the connector ends facing the same direction and parallel to each other, the apparatus further comprising:

a first retention element disposed on the first bracket and configured to maintain a connection between the first connector and the second connector, the first retention element including a first surface disposed to resist the second connector from disengaging from the first connector of the first electronic device;

a second retention element disposed on the second bracket and configured to maintain a connection between the first connector and the second connector, the second retention element including a second surface disposed to resist the second connector from disengaging from the first connector of the second electronic device; and a third retention element disposed on the third bracket and configured to maintain a connection between the first connector and the second connector, the third retention element including a third surface disposed to resist the second connector from disengaging from the first connector of the third electronic device.

6. The apparatus of claim 5, wherein the first retention element, the second retention element, and the third retention element have the same dimensions.

7. The apparatus of claim 1, wherein the first, second, and third electronic devices are fungible devices each including a first connector at a connector end, the first connector configured to connect to a second connector, and the first, second, and third brackets are configured to hold the first, second, and third electronic devices with the connector ends facing the same direction and parallel to each other in the closed position, and wherein the at least one pivot point defines a pivot axis that is parallel to the connector end.

8. The apparatus of claim 7, wherein:

the at least one pivot point includes first and second pivot points disposed on opposing sides of the first bracket;

the at least one first flange includes a first side flange connected to the first pivot point and a second side flange connected to the second pivot point and configured such that the second bracket is pivotable about the pivot axis;

the at least one second flange includes a third side flange connected to the first pivot point and a fourth side flange connected to the second pivot point and configured such that the third bracket is pivotable about the pivot axis.

9. The apparatus of claim 7, wherein:

the at least one pivot point includes a first hinge element with a hinge axis that is co-linear with the pivot axis;

the at least one first flange is disposed on the second bracket opposite the connector end and includes a second hinge element cooperating with the first hinge element such that the second bracket is pivotable about the pivot axis; and the at least one second flange is disposed on the third bracket opposite the connector end and includes a third hinge element cooperating with the first hinge element such that the third bracket is pivotable about the pivot axis.

10. The apparatus of claim 1, wherein the first, second, and third electronic devices are fungible devices each including a first connector at a connector end, the first connector configured to connect to a second connector, and the first, second, and third brackets are configured to hold the first, second, and third electronic devices with the connector ends facing the same direction and parallel to each other in the closed position, and wherein the at least one pivot point defines a pivot axis that is perpendicular to the connector end.

11. The apparatus of claim 10, wherein:

the at least one pivot point includes first and second pivot points disposed on opposing ends of the first bracket, the opposing ends of the first bracket being parallel to the connector end;

the at least one first flange includes a first end flange connected to the first pivot point and a second end flange connected to the second pivot point and configured such that the second bracket is pivotable about the pivot axis;

the at least one second flange includes a third end flange connected to the first pivot point and a fourth end flange connected to the second pivot point and configured such that the third bracket is pivotable about the pivot axis.

12. The apparatus of claim 10, wherein:

the at least one pivot point includes a first hinge element with a hinge axis that is co-linear with the pivot axis;

the at least one first flange is disposed on a first side of the second bracket perpendicular to the connector end and includes a second hinge element cooperating with the first hinge element such that the second bracket is pivotable about the pivot axis; and the at least one second flange is disposed on a first side of the third bracket perpendicular to the connector end and includes a third hinge element cooperating with the first hinge element such that the third bracket is pivotable about the pivot axis.

13. The apparatus of claim 1 further comprising:

a first latch element attached to the first bracket and a second latch element attached to the third bracket, the first and second latch elements cooperating to maintain the first, second, and third brackets in the closed position.

14. The apparatus of claim 13, wherein the first latch element includes a first edge of an opening in the first bracket and the second latch element includes an extension with a second edge configured to release-ably engage the first edge in the closed position.

* * * * *